United States Patent [19]

Shimamura et al.

[11] Patent Number: 4,963,239

[45] Date of Patent: Oct. 16, 1990

[54] SPUTTERING PROCESS AND AN APPARATUS FOR CARRYING OUT THE SAME

[75] Inventors: Hideaki Shimamura; Masao Sakata, both of Yokohama; Shigeru Kobayashi, Tokyo; Yuji Yoneoka, Yokohama; Tsuneaki Kamei, Kanagawa; Tsuneyoshi Kawahito, Yokohama; Shoyo Fujita, Gunma; Hiroshi Nakamura, Saitama, all of Japan

[73] Assignee: Hitachi, Ltd., Tokyo, Japan

[21] Appl. No.: 301,468

[22] Filed: Jan. 26, 1989

[30] Foreign Application Priority Data

Jan. 29, 1988 [JP] Japan ..................... 63-17041
Jan. 29, 1988 [JP] Japan ..................... 63-17035
Jan. 29, 1988 [JP] Japan ..................... 63-17034

[51] Int. Cl.$^5$ .................. C23C 14/42; C23C 14/54
[52] U.S. Cl. ................... 204/192.12; 204/192.17; 204/192.3; 204/298.06; 204/298.08
[58] Field of Search ............ 204/192.12, 192.17, 204/192.3, 298 TT, 298 PS, 298.06, 298.08

[56] References Cited

U.S. PATENT DOCUMENTS

| | | | |
|---|---|---|---|
| 3,732,158 | 5/1973 | Przybyszewski et al. ...... | 204/192.12 |
| 4,717,462 | 1/1988 | Homma et al. ................ | 204/298 |
| 4,747,926 | 5/1988 | Shimizu et al. ............... | 204/298 |
| 4,756,810 | 7/1988 | Lamont, Jr. et al. .......... | 204/192.3 |

FOREIGN PATENT DOCUMENTS 63-93861  4/1988  Japan .................... 204/298

*Primary Examiner*—Aaron Weisstuch
*Attorney, Agent, or Firm*—Antonelli, Terry, Stout & Kraus

[57] ABSTRACT

A sputtering process of a substrate biasing system and an apparatus for carrying out the same, capable of forming a film in satisfactory surface coverage over stepped underlying layer. The present invention solves problems in the quality of films formed by the conventional sputtering process of a substrate biasing system by regulating the bias potential of a substrate on which a film is to be formed so that the kinetic energy of ions of a sputtering gas falling on the substrate is varied periodically. The bias potential is regulated by periodically varying the amplitude of the output of a radio frequency (or dc) bias power supply or by changing the duty factor of a voltage pulse stream of the output of the radio frequency (or dc) bias power supply.

22 Claims, 11 Drawing Sheets

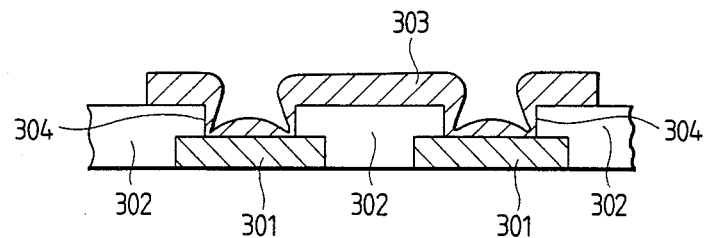
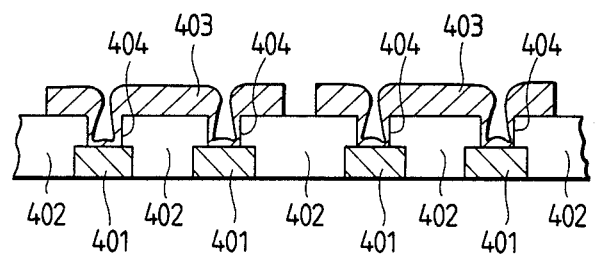
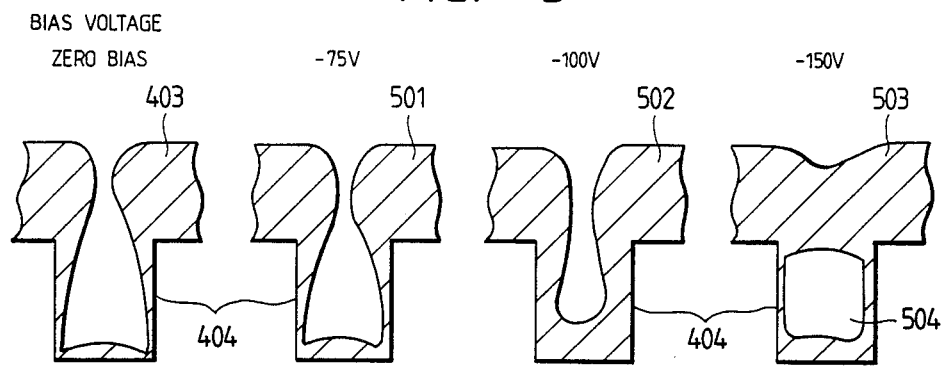

SPUTTERING PROCESS AND AN APPARATUS FOR CARRYING OUT THE SAME

BACKGROUND OF THE INVENTION

The present invention relates to a substrate bias sputtering process capable of forming a film on a substrate having satisfactory coverage, and an apparatus for carrying out the same.

Recently, the sputtering process has been applied widely to forming metallic thin films and dielectric thin films for microelectronic parts. The sputtering process is explained in detail in "Fundamentals of Thin Film Formation" (T. Asamaki, "Sputtering Phenomena", Nikkan Kogyo Shinbun —sha, 1987). The sputtering process is practiced in various systems. The present invention relates to a bias sputtering process. The background of the bias sputtering process will be described hereinafter.

FIG. 2 is a diagrammatic illustration for aid in explaining the basic concept of the bias sputtering process. As shown in FIG. 2, a sputtering electrode 202 and a substrate electrode 203 are disposed within a vacuum vessel 201. A substrate 204 on which a film is to be formed is mounted on the substrate electrode 203. After evacuating the vacuum vessel 201 by suitable evacuating means, not shown, to a high vacuum in the range of $10^{-8}$ to $10^{-7}$ torr, a sputtering gas is introduced into the vacuum vessel 201 by suitable gas supply means, not shown, to maintain the internal gas pressure of the vacuum vessel 201 at several millitorrs. Ordinarily, the sputtering gas is a rare gas, such as argon gas.

The sputtering electrode 202 is electrically energized. That is, the sputtering electrode 202 is connected to a dc high-voltage power supply 206 or a radio frequency power supply, not shown, to charge the surface of a sputtering target 205 attached to the front surface of the sputtering electrode 202 at a high negative potential. Generally, the sputtering target 205 is formed of a film forming material which is to be deposited on the substrate 204. Generally, a dc power supply is used for forming metallic films.

Upon the application of a high voltage to the sputtering electrode 202, discharge occurs at the sputtering target 205 to produce a plasma 208 in front of the sputtering target 205. Sputtering gas ions, usually, argon ions, in the plasma are accelerated by the high negative potential of the sputtering target 205 to impinge on the sputtering target 205. The impact of the sputtering gas ions on the sputtering target 205 causes the sputtering target 205 to sputter the component material to deposit the material on the substrate 204.

The substrate electrode 203 is connected to a substrate bias power supply 207. The substrate electrode 203 and the substrate bias power supply 207 are provided for maintaining the surface of the substrate at a substantially negative potential. Although it is possible to use a dc power supply as the bias power supply 207 in forming a metallic film and to use a radio frequency power supply as the bias power supply 207 in forming an insulating film, in most cases, a radio frequency power supply, which is effective for both forming a metallic film and forming an insulating film, is employed as the bias power supply 207.

The purposes of applying a bias voltage to the substrate will be itemized hereunder.

1. Removal of gaseous impurities from the film during film formation.
2. Control and improvement of the properties, such as hardness and crystallinity, of the film.
3. Improvement of the adhesion of the film to the substrate.
4. Improvement of the conformance of the film to the surface configuration of the substrate.

Although the application of a bias voltage to the substrate is a common practice, the effect of bias voltage application depends on the material used and operating conditions of the apparatus. Therefore, the foregoing purposes do not necessarily apply universally.

The prior art relating to the improvement in the conformance of a film to the surface configuration of the substrate, which is one of the objects of the present invention, will be described hereinafter.

The microminiaturization of LSIs (large-scale integrated circuits) has been promoted increasingly, which has developed a multilayer wiring structure comprising alternate layers of wiring films and insulating films for the microminiaturization of the circuits of LSI chips. One of the principal problems in the industrial production of such a multilayer wiring structure is the connection of adjacent wiring layers insulated from each other by an insulating film. The upper wiring layer and the adjacent lower wiring layer are interconnected through through holes formed in the insulating layer interposed between the upper and lower wiring layers. The size, i.e., the diameter, of the through holes has been decreased with the increasing microminiaturization of the LSI.

FIG. 3 is a sectional view showing a structure for the interconnection of adjacent wiring layers through through holes 304. In this example, the wiring lines 301 of a first wiring layer are about 3 $\mu$m in width and 1 $\mu$m in height (thickness), the wiring pattern 303 of a second wiring layer is about 1 $\mu$m in thickness, an insulating layer 302 interposed between the first and second wiring layers is 0.8 $\mu$m in thickness, and the diameter of the through holes 304 is about 2 $\mu$m. FIG. 4 shows a structure for a further minute wiring, in which wiring lines 401 of a first wiring layer are 2 $\mu$m in width. To interconnect wiring lines having a width of 2 $\mu$m, the diameter of the through holes 404 must be reduced accordingly. Therefore, the diameter of the through holes 404 of the structure shown in FIG. 4 is 1 $\mu$m.

Currently, the wiring patterns of the LSI are formed of aluminum or an aluminum alloy and, in most cases, aluminum films are formed by a sputtering process. The sputtering process, as compared with the evaporation process, is capable of forming a film well conforming to the surface configuration of the substrate. However, in forming a film over an underlying layer having sharp irregularities and holes having a small solid angle limited by the shape of the substrate, the film deposited by the sputtering process has a problem in the conformance of the film to the irregular surface configuration.

The relation between the shape of the through hole and the conformance of the film to the through hole is represented by aspect ratio. Aspect ratio is the value obtained by dividing the depth of the through hole by the diameter of the same. The greater the aspect ratio, the sharper is the shape of the through hole. The aspect ratio of the through holes shown in FIG. 3 is 0.4 and that of the through holes shown in FIG. 4 is 1.0. The conventional sputtering process is able to coat the surface of through holes having an aspect ratio below about 0.5 without any significant problem. However, the covering performance of the film deposited by the conventional sputtering process becomes unsatisfactory as the aspect ratio increases to one, as shown in FIG. 4.

Problems in coating the surface of the through holes of the LSI of a multilayer wiring structure with an aluminum film is explained in detail, for example, in "Special Edition: Flattening the Multilayer Wiring Structure", Semiconductor World, No. 10, pp. 116–137, 1984.

Various trials including forming a moderately irregular surface of an underlying layer have been made to improve the covering performance of an aluminum film formed by a sputtering process. As mentioned above, there are many reports demonstrating the effectiveness of the bias sputtering process on the improvement of the covering performance of aluminum films. The principle of the bias sputtering process relating to the improvement of the covering performance will be described hereinafter.

When the surface of a substrate is maintained at a negative potential, argon ions of a plasma produced by the sputtering electrode are accelerated by the negative potential to impinge on the surface of the substrate. It is inferred that the energy of the argon ions produces various favorable effects. When the energy of the argon ions is sufficiently large, aluminum atoms in a film deposited on the surface of the substrate are caused to sputter again, thereby leaving the film. Consequently, aluminum atoms deposited on the corner of a through hole are liable to be caused to sputter again by the impact applied thereto by the argon ions. Thus, the repetitive resputtering of aluminum atoms deposited on the surface of the substrate during the film forming process forms a smooth and substantially flat aluminum film over the surface of the through hole.

On the other hand, although the aluminum atoms do not sputter again when the energy of the argon ions is insufficient, the argon ions cause thermal excitation of the aluminum atoms deposited on the surface of the substrate. Since the kinetic energy of the argon ions is greater than the bond energy of the aluminum atoms, the argon ions are able to rearrange the aluminum atoms in the deposited aluminum film, even if the argon ions are unable to cause the resputtering of the aluminum atoms.

Actually, it is possible that the argon ions provide the foregoing two effects simultaneously. Improvements in the covering performance of aluminum films are reported in David W. Skelly et al., "Significant Improvement in Step Coverage Using Bias Sputtered Aluminum", *J. Vac. Sci. Technol.* A4(3), pp. 457–460, May/June, 1986.

FIG. 5 shows the results of through hole coverage tests, in which the level of the dc substrate bias voltage applied to the substrate was varied in forming aluminum films of 1 μm in thickness over the surfaces of through holes of 1 μm in diameter and 1.3 μm in depth to evaluate the effect of the dc substrate bias voltage on the through hole coverage of the aluminum films. In FIG. 5, indicated at 501 is the sectional shape of an aluminum film for a substrate bias voltage of −75 V, at 502 is the sectional shape of an aluminum film for a substrate bias voltage of −100 V, at 503 is the sectional shape of an aluminum film for a substrate bias voltage of −150 V, and at 403 is the sectional shape of an aluminum film when the substrate bias voltage is zero. The sectional shape 501 and the sectional shape 403 are substantially the same, which proves that the coverage improving effect of a substrate bias voltage of −75 V is insignificant. As is obvious from the sectional shape 502, the aluminum film conforms satisfactorily to the surface of the through hole and a substrate bias voltage of −100 V is effective for improvement of the coverage. The substrate bias voltage of 31 150 V deteriorates the through hole coverage of the aluminum film. It is considered to be due to the obstruction of the deposition of aluminum in the through hole by an overhang portion of the aluminum film around the edge of the through hole caused by an excessive rise in temperature of the aluminum film deposited around the through hole. In the worst case, the through hole is closed by the portion of the aluminum film overhanging the through hole to form a void 504 within the through hole, which greatly deteriorates the reliability of the through hole as means for interconnecting wiring patterns.

Thus, the bias sputtering process is able to form a film in satisfactory conformance to the configuration of a surface. However, the bias sputtering process has the following problems in its practical application.

1. The film formed by the bias sputtering process absorbs argon (sputtering gas). The argon absorption of the film increases with increase in the bias voltage. In the LSI manufacturing process, a LSI chip is subjected to an annealing process after the film forming process. The LSI chip is exposed to a high temperature in the range of 430 to 475° C. in the annealing process, whereby argon atoms contained in the aluminum film condense within the aluminum film and break weak portions of the aluminum film, thereby forming small holes of several microns to several hundreds of microns in the aluminum film. Such a tendency is more noticeable when the bias voltage is higher.

2. The application of a bias voltage increases the specific resistance of the film. For example, an aluminum film of 1 μm in thickness formed by a sputtering process without using any bias voltage has a specific resistance on the order of 2.7 $\mu\Omega^{-cm}$. However, the specific resistance increases with increase in the bias voltage. The electrical conductivity of a thin film is limited mainly by crystalline defects in the grain boundaries. Accordingly, it is appropriate to consider that a thin film having a high electrical resistance has many crystalline defects.

3. The aluminum film formed by the bias sputtering process has a comparatively low reflectance. Power is supplied to the substrate owing to the substrate bias voltage and the resulting current to increases the temperature of the substrate excessively during the film forming, process. As a result, excessively coarse grains are formed, thereby reducing the specular reflectance. The specular reflectance is a significant factor affecting conditions for the exposure of a photoresist in the following patterning process, and hence the specular reflectance must be higher than a certain level dependent on the wavelength of light used for exposure.

Generally, in the process of growth of an aluminum thin film, it is considered that, initially, aluminum nuclei are formed on the surface of a substrate, the aluminum nuclei grow to form individual island structures (up to 80 Å), and then the individual island structures join together to form a continuous, uniform film (up to 200 Å). Thus, the quality of the thin film is affected by all the film forming conditions from the initial stage of the film forming process before the continuous thin film is formed.

On the other hand, as mentioned above with reference to the conventional techniques, it is possible to improve the crystallinity of the thin film and the adhesion of the same to the substrate by applying a bias voltage to the substrate. The application of the bias voltage to the substrate at the initial stage of the film forming process, in which the aluminum nuclei are formed, is particularly effective for forming a thin film having improved quality. In a stage immediately after the start of the film forming process (up to 200 Å), the nuclei are formed in individual island structures and hence the underlying insulating film is partly exposed; consequently, the dc bias sputtering process is unable to apply a dc bias voltage uniformly to the surface of the substrate on which the aluminum is to be deposited. Accordingly, the radio frequency biasing method capable of applying a bias voltage to the surface of the substrate through the insulating film is advantageous over the dc biasing method. However, when radio frequency power is applied to the substrate for biasing the substrate, argon ions having comparatively high energy impinge on the substrate, which enhances the aforesaid problems in the practical application of the dc bias sputtering process

SUMMARY OF THE INVENTION

Accordingly, it is a first object of the present invention to provide a biased substrate sputtering process and an apparatus for carrying out the same capable of eliminating the disadvantages of the conventional bias sputtering process and forming a film satisfactorily conforming to the configuration of the underlying surface.

It is a second object of the present invention to provide a biased substrate sputtering process and an apparatus for carrying out the same using radio frequency power, capable of eliminating the disadvantages of the conventional bias sputtering process and forming a film satisfactorily conforming to the configuration of the underlying surface.

It is a third object of the present invention to provide a biased substrate sputtering process of a substrate biasing system and an apparatus for carrying out the same designed so as to apply bias voltage intermittently to a substrate and employing a double electromagnet sputtering catnode capable of optionally moving a plasma ring, and capable of forming a film satisfactorily conforming to the configuration of the underlying surface in a uniform film thickness distribution.

It is a fourth object of the present invention to provide a biased substrate sputtering process of and an apparatus for carrying out the same employing a filter which is disposed between a target and a substrate to enhance the directivity of sputtered particles and controlling the substrate bias voltage intermittently, and capable of forming a film satisfactorily conforming to the configuration of the underlying surface.

To achieve the first object of the invention, the present invention provides a biased substrate sputtering process which applies a bias voltage to a substrate during film formation within a vacuum atmosphere, characterized in that the substrate bias voltage is controlled so that the magnitude of kinetic energy of ions of the sputtering gas impacting on the substrate varies periodically.

To achieve the second object of the invention, the present invention provides a biased substrate sputtering process and an apparatus for carrying out the same characterized in that a radio frequency bias voltage is applied to a substrate, and the mean voltage of the radio frequency bias voltage is varied intermittently.

To achieve the third object of the invention, the present invention provides a biased substrate sputtering process employing a sputtering arrangement including a target and an coaxial arrangement of annular exciting coils, which is capable of optionally varying position where a plasma is produced by varying the ratio of distribution of current to the coils.

To achieve the fourth object of the invention, the present invention provides a sputtering process of a substrate and an apparatus for carrying out the same characterized in that a filter is provided to control the directivity of particles sputtering from a target.

The features of the present invention will be described hereinafter in contrast with the conventional techniques.

There has been known a bias sputtering process in which a radio frequency power of a fixed amplitude is applied to a substrate. A radio frequency electric field of a frequency exceeding 10 MHz is applied to a plasma produced in a sputtering apparatus. Because the mass of positive ions of a sputtering gas, such as argon ions, is 1000 times or more than that of electrons, the positive ions are unable to follow the variation of the radio frequency electric field on the order of 10 MHz, whereas electrons are able to follow perfectly the variation of radio frequency electric field of 1 GHz or below. In a radio frequency electric field of a frequency on the order of 10 MHz, the substrate electrode is biased at a negative potential (self-biased) relative to the plasma, which will be described afterward. The self-bias potential is a dc potential which remains constant with respect to time, provided that discharge conditions are fixed. The positive ions of the sputtering gas fall steadily on the dc self-biased substrate electrode regardless of the polarity of the radio frequency electric field.

As mentioned above, even in the case of the known bias sputtering process employing a radio frequency power supply as a biasing power supply, the positive ions of the sputtering gas are unable to follow the variation of the polarity of the radio frequency electric field when the frequency of the biasing radio frequency power is on the order of 10 MHz. Consequently, the magnitude of the kinetic energy of the positive ions of the sputtering gas will not vary periodically.

It is a feature of the present invention to apply a bias voltage having a frequency of 1 MHz or below, thereby allowing the positive ions of the sputtering gas to follow the variation of the polarity of the electric field of the substrate electrode so that the magnitude of the kinetic energy of the positive ions varies periodically. The present invention thus controls the kinetic energy of the positive ions in the sputtering process to form a film which could not have been obtained by the conventional bias sputtering processes.

BRIEF DESCRIPTION OF THE DRAWINGS

FIG. 3 is a fragmentary sectional view showing the conformance of an aluminum film formed by a sputtering process to through holes having a small aspect ratio;

FIG. 4 is a view similar to FIG. 3, showing the conformance of an aluminum film formed by a sputtering process to through holes having a large aspect ratio;

FIG. 5 is an enlarged sectional view for aid in explaining the conformance of aluminum films formed by a conventional bias sputtering process to through holes for bias voltage as parameter;

DETAILED DESCRIPTION OF THE PREFERRED EMBODIMENTS

Figure 1:
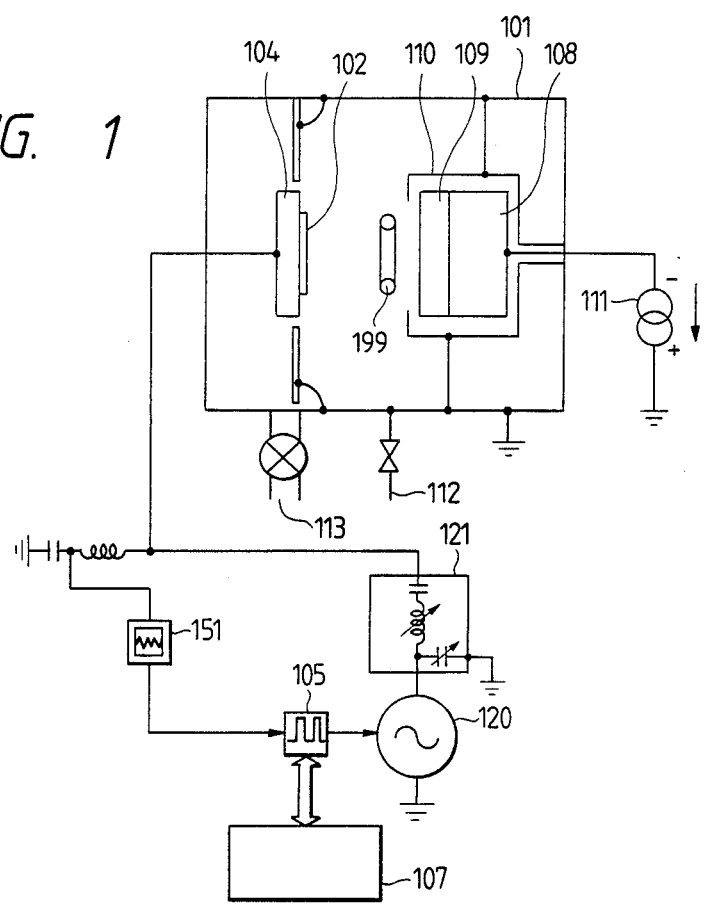
FIG. 1 is a diagrammatic illustration of a sputtering apparatus in a first embodiment according to the present invention, in which a radio frequency bias voltage is applied to a substrate electrode.
Figure 2:
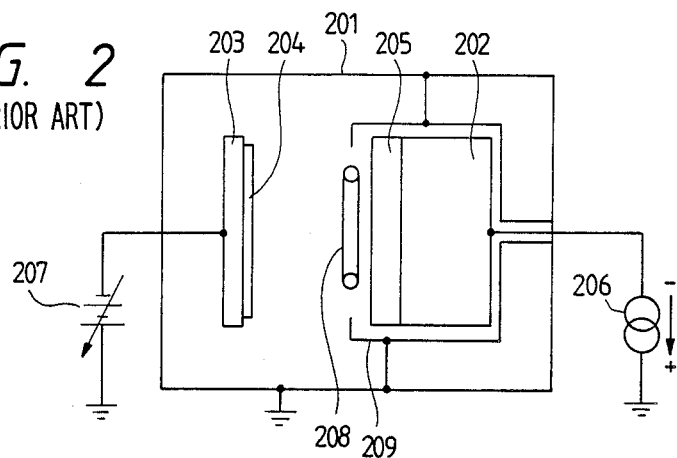
FIG. 2 is a diagrammatic illustration for aid in explaining a conventional bias sputtering process.

First, a substrate bias applying system using radio frequency power will be described briefly.

A radio frequency power supply applies a voltage, alternating with respect to ground potential, to a substrate on which a film is to be formed. The substrate is dc-insulated from the radio frequency power supply. Whereas electrons of a plasma can be alternately attracted and repulsed by the substrate according to the voltage waveform, argon ions are unable to move in a space under the influence of an electric field according to the direction of the radio frequency voltage, because the argon ions have a large mass, and hence a large inertia. Consequently, the quantity of negative charge on the substrate is greater than that of positive charge, so that the surface of the substrate is charged at a negative potential and hence the voltage waveform on the surface of the substrate is shifted to the negative side.

The quantity of shift of the voltage waveform increases with increase in the input radio frequency power. The quantity of shift substrate bias voltage is generally designated as a self-bias voltage $V_{dc}$. The self-bias voltage $V_{dc}$ increases with an increase in the negative voltage amplitude. The self-bias voltage $V_{dc}$ produces an electric field which accelerates the argon ions of the plasma toward the substrate. Thus, the function of the self-bias voltage $V_{dc}$ is equivalent to that of a substrate bias voltage in the dc substrate bias system, except that the self-bias voltage $V_{dc}$ is able to maintain the surface of the substrate at a bias voltage even immediately after a film forming operation has been started and no metallic film has been deposited on the surface of the substrate.

The inventors of the present invention found through experiments that the bias voltage must be higher than a certain level to achieve significant improvement in surface coverage in the bias sputtering process. More precisely, the negative substrate bias voltage must be greater than the potential of the plasma at least by $-100$ V, otherwise the surface coverage is not improved.

It is inferred from the results of the experiments that a bias voltage on the order of $-100$ V below the potential of the plasma must be applied to the substrate to disperse aluminum atoms on the surface of a growing film over the surface of the film.

In an experimental apparatus used by the inventors of the present invention, the potential of the plasma was about $+20$ V and the self-bias voltage $V_{dc}$ was $-150$ V when the output power of the power supply was 200 W. Therefore, the bias voltage applied to the substrate was $-170$ V with respect to the potential of the plasma. When a power of 200 W was applied continuously to the substrate, the temperature rise on the surface of the substrate estimated from the specular reflectance of the film formed over the substrate was 400° C. or higher. To reduce such an effect of power, the magnitude of power was varied periodically instead of applying a simple radio frequency power of a fixed waveform so that a large power was applied intermittently to the substrate so that the duration of the application of a high negative substrate bias was reduced. In this specification, the ratio of the period of repetition of application of a high negative bias voltage to the duration of application of a low negative voltage is designated as duty factor. When the duty factor is an appropriately small value, the power applied to the substrate in one period can be reduced while the substrate bias voltage is maintained at a sufficiently high level for the effective improvement of surface coverage.

Figure 8:
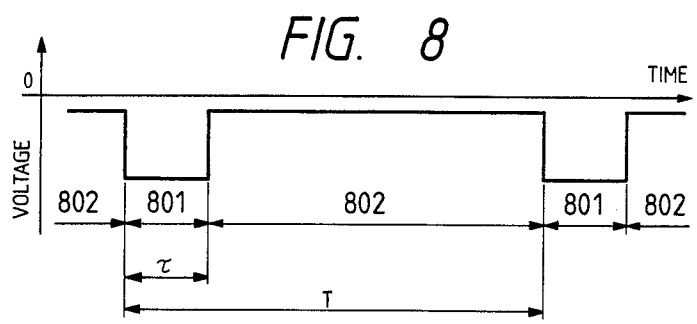
FIG. 8 is a voltage waveform chart showing the self-bias voltage $V_{dc}$ of the substrate electrode corresponding to the mean voltage of the voltage shown in FIG. 7.

FIG. 8 shows an example of the waveform of the substrate bias voltage $V_{dc}$ on the surface of the substrate when a high power and a low power are applied alternately to the substrate. The power is 200 W during a period 801 where the negative substrate bias voltage $V_{dc}$ is high ($-150$ V), the power is 10 W during a period 802 where the negative substrate voltage $V_{dc}$ is low ($-10$ V) and the duty factor is 0.2. Accordingly, the mean input power is $10W \times 0.8 + 200W \times 0.2 = 48W$.

The substrate bias voltage $V_{dc}$ having a waveform as shown in FIG. 8 is applied to the substrate in the following manner.

Figure 10:
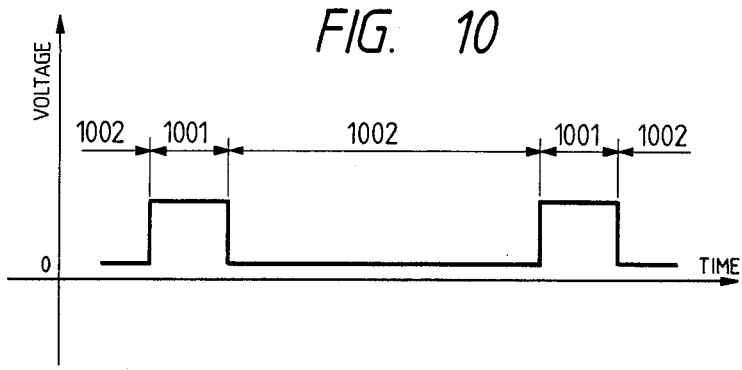
FIG. 10 is a waveform chart showing the waveform of the output voltage of a voltage pulse generator shown in FIG. 1.

The waveform (rectangular or sinusoidal) of the substrate bias voltage $V_{dc}$ on the surface of the substrate, the output substrate bias voltage and the duty factor are set by a computer. A set of these data is designated as a file. The file (about 10 KHz, duty factor: 0.01 to 0.99) is applied to a voltage pulse generator, and then the voltage pulse generator generates a voltage pulse signal to be applied to the radio frequency power supply on the basis of the set data applied thereto. Then, the radio frequency power supply applies an output voltage of the waveform determined by the voltage pulse generator to the substrate. In the following description, the substrate bias voltage included in the file, by way of example, has a square pulse waveform with a maximum negative bias voltage of $-150$ V, a minimum negative bias voltage of $-10$ V, a duty factor of 0.2 and a frequency of 10 kHz. FIG. 10 shows the waveform of a voltage pulse signal generated by the voltage pulse generator on the basis of the data file, in which time is measured on the horizontal axis, and voltage is measured on the vertical axis. When the square pulse waveform has a duty factor of 0.2 and a frequency of 10 kHz, a high-voltage period 1001 in which the negative substrate bias voltage is high and a low-voltage period 1002 in which the negative substrate bias voltage is low alternate with each other as shown in FIG. 10. The radio frequency power supply applies power according to the voltage waveform shown in FIG. 10 to apply a high power, for example, about 200 W, to the substrate during the high-voltage period 1001 and a low power, for example, about 10 W, to the substrate during the low-voltage period 1002 at a duty factor of 0.2 and a frequency of 10 kHz to apply a bias voltage determined by the file to the substrate. Bias condition during the film forming process can be stabilized by detecting the substrate bias voltage $V_{dc}$ and controlling the output of the radio frequency power supply through a feedback control circuit so that the voltage waveform of the substrate bias voltage $V_{dc}$ agrees with the voltage waveform decided by the data included in the file.

The file may be changed during the film forming process. Timing of changing the file and the change of the contents of the file can be controlled by the computer It is essential to the improvement of the surface coverage of the film and to the improvement of the quality of the film to use several files sequentially for the film forming process, taking into consideration the shape and quality of the underlying surface A bias sputtering process in a first embodiment according to the present invention will be described hereinafter with reference to FIGS. 1 and 6 to 10.

In the first embodiment, power is applied in two power levels to the substrate on which a film is to be formed.

Referring to FIG. 1, a bias sputtering apparatus according to the present invention is a planar magnetron sputtering apparatus comprising a vacuum vessel 101 having a sputtering gas inlet opening 112 and an evacuating opening 113, a sputtering electrode 108 disposed within the vacuum vessel 101, a target 109 mounted on the sputtering electrode 108, an anode 110 disposed outside a target eroding region so as to surround the target 109 and the sputtering electrode 108 with a gap of about 2 mm therebetween, a substrate 102 on which a film is to be formed, disposed opposite to the sputtering electrode 108, and a substrate electrode 104 for applying a voltage to the substrate 102. The target 109 is, for example, an aluminum alloy of aluminum of a high purity of 99.999% or higher and 1% by weight silicon (hereinafter referred to as "aluminum"). The substrate 102 is a single crystal silicon wafer of 125 mm in diameter. The sputtering electrode 108 is connected to a dc power supply or a radio frequency power supply 111, while the anode 110 and the vacuum vessel 101 are grounded. The substrate electrode 104 is connected through a matching circuit 121 to a radio frequency power supply 120 of 13.56 MHz in basic frequency for applying a substrate bias voltage according to the present invention to the substrate 102. The radio frequency power supply 120 is connected to a voltage pulse generator 105, which generates a voltage pulse signal by which the output power of the radio frequency power supply 120 to be applied to the substrate electrode 104 is varied periodically. The voltage pulse generator 105 is connected to a computer 107 for controlling the biasing conditions. The computer 107 stores waveforms of the substrate bias voltage, substrate bias voltages, duty factors and frequencies of the waveform of the output voltage of the radio frequency power supply 120 in a plurality of data files. The data files are used selectively during a film forming process.

The vacuum vessel 101 is evacuated by an evacuator, not shown, connected to the evacuating opening 113 to maintain the partial pressure of the residual gas within the vacuum vessel 101 in the range of $10^{-8}$ to $10^{-7}$ torr Then, argon gas of high purity is introduced through the gas inlet opening 112 into the vacuum vessel 101 so that the partial pressure of the argon gas is on the order of 3 millitorr, and then a power in the range of 10 to 20 kW is applied to the sputtering electrode 108 to produce a first argon plasma 199 of a high density over the target 109 to sputter the aluminum from the target 109. The aluminum thus sputtered is deposited on the surface of the substrate 102. On the other hand, simultaneously with the start of the film forming process, radio frequency power varying periodically is applied to the substrate electrode 104 in order that the negative substrate bias voltage is increased periodically to produce a second plasma, which need not be produced positively, on the substrate 102 for bias sputtering.

When the second plasma is not produced positively, a negative self-bias $V_{dc}$ can be applied to the substrate 102 by utilizing the diffusion of argon ions and electrons of the first plasma 199 produced around the target 109 toward the substrate 102 owing to the power applied to the sputtering electrode 108, even if a low power which is unable to cause the substrate electrode 104 to discharge is applied to the substrate electrode 104. In such a case, the peak voltage of the radio frequency voltage applied to the substrate 102 does not exceed zero volts, namely, the radio frequency voltage is always on the negative side. Accordingly, the substrate 102 continues to discharge while a second power (a low power), which is unable to cause self-discharge, is applied to the substrate electrode 104. That is, as mentioned above, when a dc voltage is applied to the substrate 102, both a first power, which will be described afterward, and the second power need not be voltages capable of exciting the substrate 102 for self-discharge, which is similar to the application of a dc voltage to the substrate not for the purpose of producing a plasma directly on the substrate 102. Since the substrate 102 is biased at a negative potential while the first and second powers are applied thereto, only argon ions are accelerated toward the substrate 102, while electrons are repelled. When a dc voltage is applied to the substrate 102, the shallowest substrate bias voltage $V_s$ is reduced to a value slightly below the floating potential of the substrate 102 to suppress the flow of electron current through the substrate 102 to the minimum possible, because it is known that electron current raises the temperature of the substrate 102 excessively and that the excessively high temperature can possibly cause damage to the film, such as melting the film or reducing the reflectance of the film. From such a point of view, it is also undesirable to cause an electron current flow through the substrate 102 while applying radio frequency voltage to the substrate 102. Therefore, in view of forming a film of a satisfactory quality, a known process disclosed in Japanese Patent Laid-open No. 61-264174, in which a negative dc bias voltage is decreased temporarily substantially to the ground potential to cause electrons to flow into the surface of the substrate, is not a desirable process In this embodiment, the thickness of the aluminum film formed on the substrate in a wiring pattern, for interconnecting semiconductor devices or interconnecting wiring patterns formed respectively in adjacent wiring layers is about 1μm.

Figure 6:
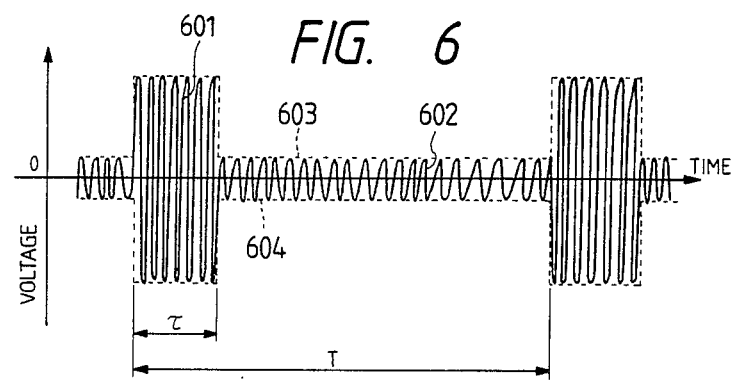
FIG. 6 is a voltage waveform chart showing the voltage waveform of the output voltage of the radio wave power supply of FIG. 1.

A method of applying a bias voltage to the substrate by using a radio frequency power will be described hereinafter. FIG. 6 shows the waveform of the output voltage of the radio frequency power supply 120, in which voltage is measured on the vertical axis, time is measured on the horizontal axis, and the waveform is expanded along the horizontal axis to facilitate understanding. The frequency of the output voltage is 13.56 MHz. The first power applied to the substrate 102 is 200 W for a large voltage amplitude 601, and the second power applied to the substrate 102 is 10 W for a small voltage amplitude 602. The positive and negative voltage amplitudes of the first and second voltages with respect to zero volts are equal to each other.

Figure 7:
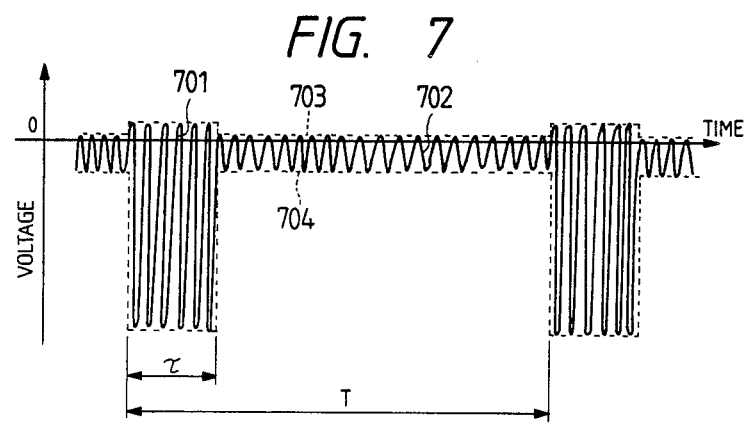
FIG. 7 is a voltage waveform chart showing the waveform of the voltage of the substrate electrode of FIG. 1 when the radio frequency output voltage of FIG. 6 is applied to the substrate electrode.

The output radio frequency power of the radio frequency power supply 120 periodically varying in amplitude is applied through the matching circuit 121 to the substrate electrode 104 to produce the second plasma on the substrate 102. FIG. 7 shows the voltage waveform of a voltage on the surface of the substrate 102, in which voltage is measured on the vertical axis, and time is measured on the horizontal axis. The voltage waveform shown in FIG. 7 varies according to the periodic variation of the amplitude of the output voltage of the radio frequency power supply 120. FIG. 8 shows the waveform of the quantity of shift of the waveform shown in FIG. 7 from the waveform shown in FIG. 6, namely, the self-bias voltage $V_{dc}$, in which voltage is measured on the vertical axis, and time is measured on the horizontal axis. In this embodiment, a first self-bias voltage $V_{dc}$ is $-150$ V when the first power of 200 W is applied to the substrate 102, and is $-10$ V when the record power of 10 W is applied to the substrate 102. The duty factor is represented by $\tau/T$ where $\tau$ is a time interval in which the first self-bias voltage $V_{dc}$ is applied to the substrate 102 in one cycle of the waveform of the self-bias voltage $V_{dc}$, and T is the period of the waveform of the self-bias voltage $V_{dc}$. Thus, a power effective for the improvement of surface coverage is applied to the substrate 102 for $\tau$ sec in T sec. The time interval $\tau$ in which the first power is applied to the substrate 102 increases as the duty factor increases from 0 to 1. Suppose that, in FIG. 8, the time $\tau$ is 20 microsec and the period T is 100 microsec. Then, a binary voltage pulse signal, namely, alternate pulses of the first and second self-bias voltages $V_{dc}$, of a duty factor of 0.2 is applied to the substrate electrode 104 at a frequency of 10 kHz (period: 100 microsec). Since the frequency of the binary voltage pulse signal is 10 kHz, argon ions can impact the substrate 102 according to the variation of the self-bias voltage $V_{dc}$ for bias sputtering to form a film.

The frequency of the pulses of the first power or the dc voltage applied to the substrate 102 is not limited to 1 kHz or 10 kHz. The voltage pulse may be applied to the substrate 102 only several times or several tens of times throughout the film forming process for forming a film of a desired thickness or the frequency of application of the voltage pulse may be such a low frequency that the substrate 102 is not excited for self-discharge by the self-bias voltage $V_{dc}$. (Self-discharge occurs when the frequency is higher than about 1 MHz.)

During the film forming process, the biasing condition can be stabilized by detecting the substrate bias voltage $V_{dc}$ and controlling the output of the radio frequency power supply 120 through a feedback circuit 151 to vary the level of the voltage waveform shown in FIG. 10 so that the substrate bias voltage $V_{dc}$ will meet the data included in the file.

Figure 9A:
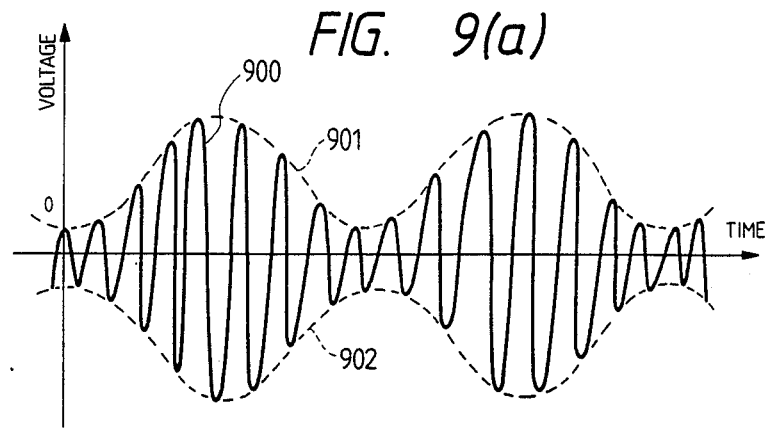
FIG. 9(a) is a waveform chart showing another waveform of the output voltage of the radio frequency power supply of FIG. 1.
Figure 9B:
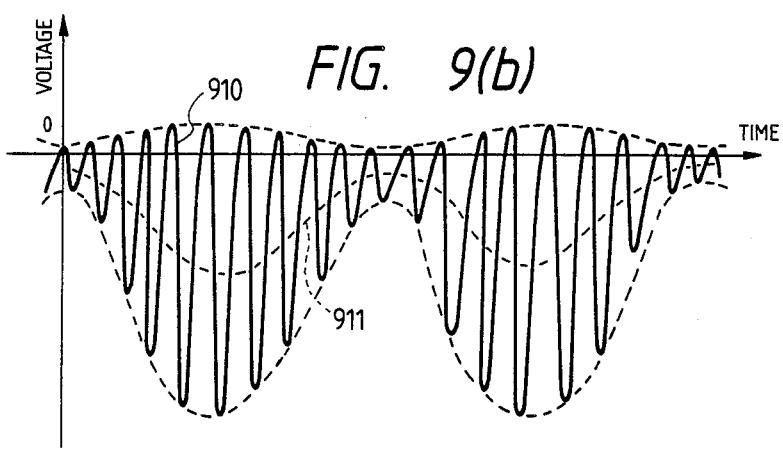
FIG. 9(b) is a waveform chart showing the waveform of the voltage of the substrate electrode when an output radio frequency output voltage of the radio frequency power supply of FIG. 1 is applied to the substrate electrode.

Although the output power of the radio frequency power supply 120 of the first embodiment is varied between two values, the values of the output power need not be limited thereto, but the output power may be varied between any suitable number of values within one period. Accordingly, the output power of the radio frequency power supply 120 may be varied in a waveform of a continuously and periodically variable amplitude as shown in FIG. 9(a), in which voltage is measured on the vertical axis and time is measured on the horizontal axis. In FIG. 9(a), the output power of the radio frequency power supply 120 is controlled so that envelopes 901 and 902 successively connecting the upper and lower peak voltages, respectively, of the voltage amplitudes are sinusoidal waves. When the output power of the radio frequency power supply 120 having a waveform as shown in FIG. 9(a) is applied to the substrate electrode 104, the voltage on the substrate electrode 104 has a waveform 910 shown in FIG. 9(b) and the self-bias voltage $V_{dc}$ varies in a voltage waveform 911 shown also in FIG. 9(b). Thus, the bias potential of the substrate 102 can be varied periodically.

A time interval in which the values of the self-bias voltage $V_{dc}$ are above the mean voltage of the voltages represented by the waveform 911 and a time interval in which the values of the self-bias voltage $V_{dc}$ are below the mean voltage in one period are substantially equal to each other. A film of a quality superior to that of the conventional film can be formed by applying a voltage varying in a waveform shown in FIG. 14(a) to the substrate 102. In such a case, it is considered that the power applied to the substrate 102 varies between more than two values as the peak voltage in a high voltage period varies substantially continuously, and a time interval in which the values of the self-bias voltage $V_{dc}$ are below the mean voltage is shorter than a time interval in which the values of the self-bias voltage $V_{dc}$ are above the mean voltage.

Figure 14A:
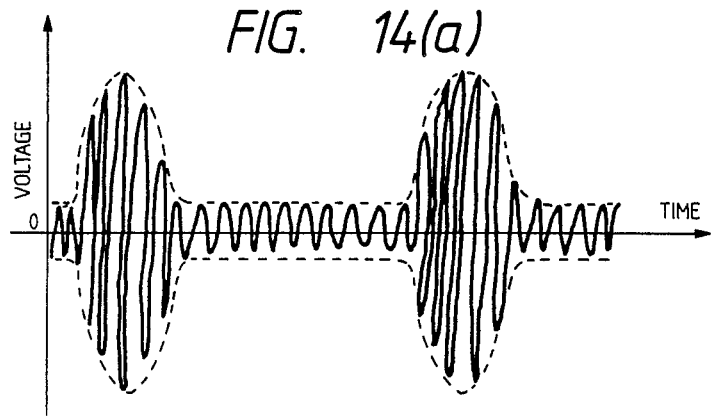
FIG. 14(a) is a waveform chart showing a third example of a waveform of the output voltage of the radio frequency power supply of FIG. 1.
Figure 14B:
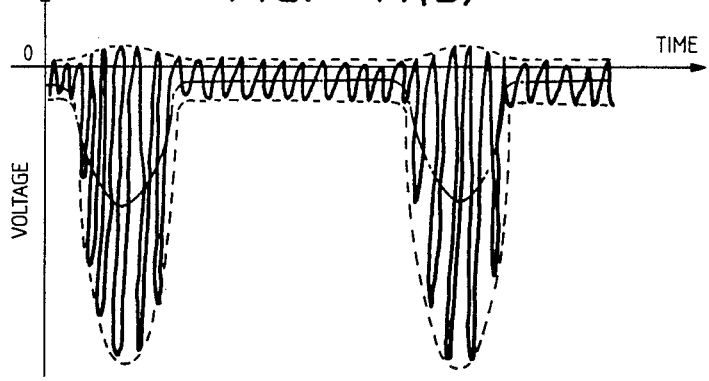
FIG. 14(b) is a waveform chart showing the waveform of the voltage of the substrate electrode when the output voltage of the radio frequency power supply of FIG. 14(a) is applied to the substrate electrode.

A bias voltage of a voltage waveform shown in FIG. 14(a) may be applied instead of the bias voltage of a voltage waveform shown in FIG. 9(a). In such a case, the voltage of the substrate electrode 104 has a voltage waveform shown in FIG. 14(b).

The waveform, the deepest value, the shallowest value, the duty factor and the period of the bias voltage applied to the substrate may be varied within the scope of the present invention.

Another mode of film forming operation in which the data file is changed during the sputtering process will be described hereinafter.

As mentioned above, the data file defining the biasing condition includes data representing the deepest substrate bias voltage $V_d$, the shallowest substrate bias voltage $V_s$, the duty factor, the period and the waveform. Values for those data are set in individual data files by the computer. One data file having data representing an appropriate biasing condition among those data files is selected. The data file may be changed for another during the film forming operation. Naturally, only a single data file may be used throughout the film forming operation.

It is effective to use two data files for one cycle of the film forming operation to carry out the film forming operation in two stages, namely, a first stage for depositing a film in a satisfactory surface coverage and a second stage for suppressing rise in temperature of the substrate. For example, a first data file defining a rectangular voltage pulse signal of $V_s = -10$ V, $V_d = -150$ V, duty factor $= 0.4$ and period $= 100$ microsec, and a second data file defining a rectangular voltage pulse signal of $V_s = -10$ V, $V_d = -150$ V, duty factor $= 0.1$ and period $= 100$ microsec are used for bias sputtering. The sputtering apparatus employed in this embodiment required about 10 W to apply a substrate bias voltage of $-10$ V to the substrate and about 200 W to apply a substrate bias voltage of $-150$ V to the substrate. When the first data file is changed for the second data file, the duty factor decreases from 0.4 to 0.1, whereby the power applied to the substrate can be reduced to about a third the power applied to the substrate when the first data file is used.

On the other hand, unlike a silicon dioxide film, an underlying layer formed of an organic substance, such as a polyimide compound, is susceptible even to a small ion impact and can affect the quality of the film. When the underlying layer is formed of an organic substance, it is effective to apply a low power to the substrate or to apply no bias voltage to the substrate in the initial stage of the film forming operation and to apply an appropriate power to the substrate in the final stage of the film forming operation.

Thus, any number of data files differing from each other in contents may be used selectively during one cycle of the film forming operation taking into consideration the dimensions of through holes and the properties of the underlying layer.

The present invention is not limited in its application to a bias sputtering process for forming aluminum wiring films. The present invention is capable of forming improved wiring films of all kinds of metals, such as Ti, Mo and W, and alloys of those metals in addition to aluminum wiring films including aluminum alloy wiring films regardless of the number of laminated layers of the wiring films. Furthermore, the present invention is capable of forming films having satisfactory surface coverage and improved properties on substrates formed of a variety of materials including inorganic substances, such as $SiO_2$ and SiN, and organic substances, such as polymers.

The effects of the bias sputtering process in the first embodiment according to the present invention will be described hereinafter as applied to forming aluminum wiring films for semiconductor devices in terms of:

1. Effect on the improvement of surface coverage
2. Effect on the suppression of rise in temperature of the film
3. Effect on the improvement in quality of films owing to the possibility of applying a substrate bias voltage to the substrate in the initial stage of the film forming process
4. Effect of carrying out the film forming operation under two or more biasing conditions in one cycle of the film forming operation.

In the following description, it is supposed that the second power is fixed at 10 W ($V_{dc} = -10$ V), and the thickness of the film is fixed at 1 μm.

Figure 11:
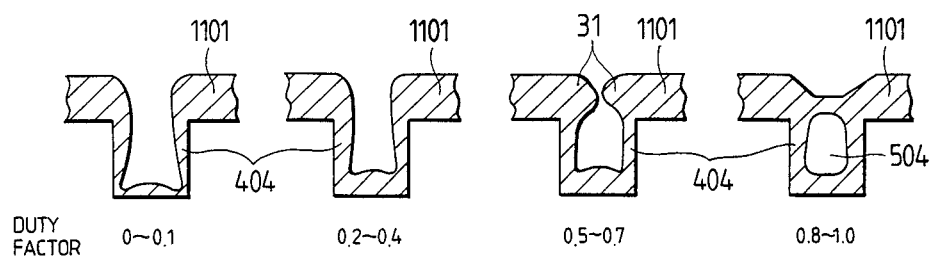
FIG. 11 is an illustration for aid in explaining the conformance of films formed by the bias sputtering process of the present invention to through holes with duty ratio as a parameter.

FIG. 11 shows the through hole coverage of films with duty factor as a parameter. When a radio frequency power of 200 W is applied continuously to the substrate electrode 104 to apply a bias voltage $V_{dc}$ of $-150$ V to the substrate electrode 104, the through hole coverage of a film thus formed is unsatisfactory and a void is formed in the through hole as shown in FIG. 5. The through hole coverage of the film can be improved by periodically varying the magnitude of the input power to intermittently apply a pulse of the bias volta $V_{dc}$ to the substrate 104. The first power is 200 W ($V_{dc} = -150$ V). As is obvious from FIG. 11, although a void is not formed, noticeable improvement is not made in the through hole coverage when the duty factor is in the range of 0 to 0.1. When the duty factor is in the range of 0.2 to 0.4, the film conforms satisfactorily to the configuration of the underlying layer. When the duty factor is in the range of 0.5 to 0.7, overhangs 31 of the aluminum film are formed due to excessive rise in temperature of the aluminum film to obstruct film formation over the surface of the through hole. When the duty factor is 0.8 or above, a void is formed in the through hole due to the impact of excessive argon ions on the aluminum film, which is the same as the result shown in FIG. 5 where a power of 200 W ($V_{dc} = -150$ V) is applied continuously to the substrate electrode 104.

The reflectance of the surface of the film, representing the surface roughness of the film, will be described as a measure to indicate effect on the suppression of rise in temperature of the film.

Figure 12:
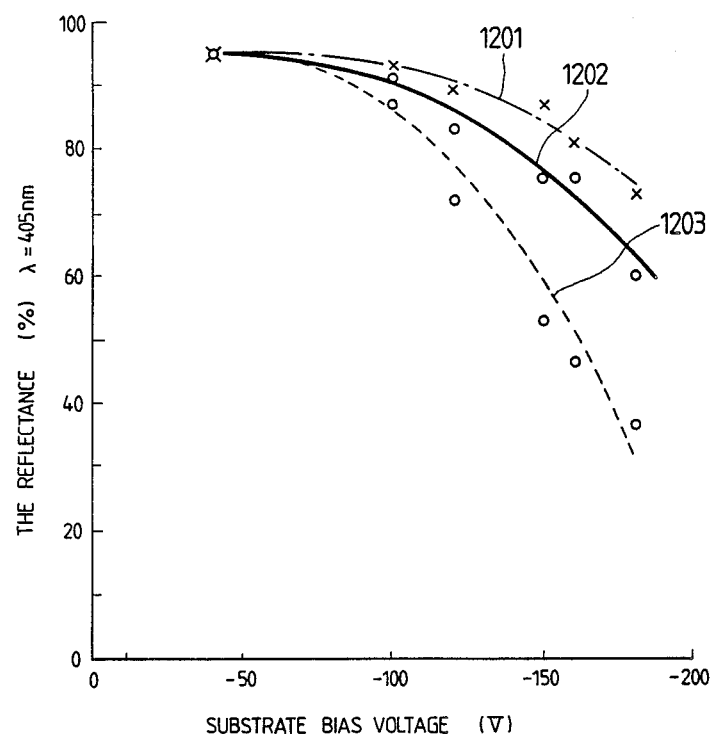
FIG. 12 is a graph showing the relation between the reflectance of the surfaces of aluminum films formed by a bias sputtering process and substrate bias voltage with duty ratio as a parameter.

FIG. 12 shows the results of measurement of reflectance of the surfaces of aluminum films by using a monochromatic light of 405 nm in wavelength, in which the substrate bias voltage $V_{dc}$ is measured on the horizontal axis. Curves 1201, 1202 and 1203 indicate the variation of reflectance with substrate bias voltage respectively for duty factors of 0.2, 0.5 and 1 (equivalent to the condition of substrate bias voltage application in the conventional process). In either case, the reflectance decreases with the increase of substrate bias voltage; however, the reduction of reflectance is smaller when the duty factor is smaller. When a substrate bias voltage of −150 V is applied to the substrate electrode in a manner capable of forming a film of satisfactory through hole coverage as shown in FIG. 11, the reflectance of the film is as low as about 50% for a duty factor of 1, which is equivalent to the condition of substrate bias voltage application in the conventional process, while the reflectance of the film is as high as 85% for a duty factor of 0.2. Thus, the first embodiment of the present invention is capable of forming a film having a high reflectance, and hence capable of preventing excessive rise in temperature of the film.

Figure 15:
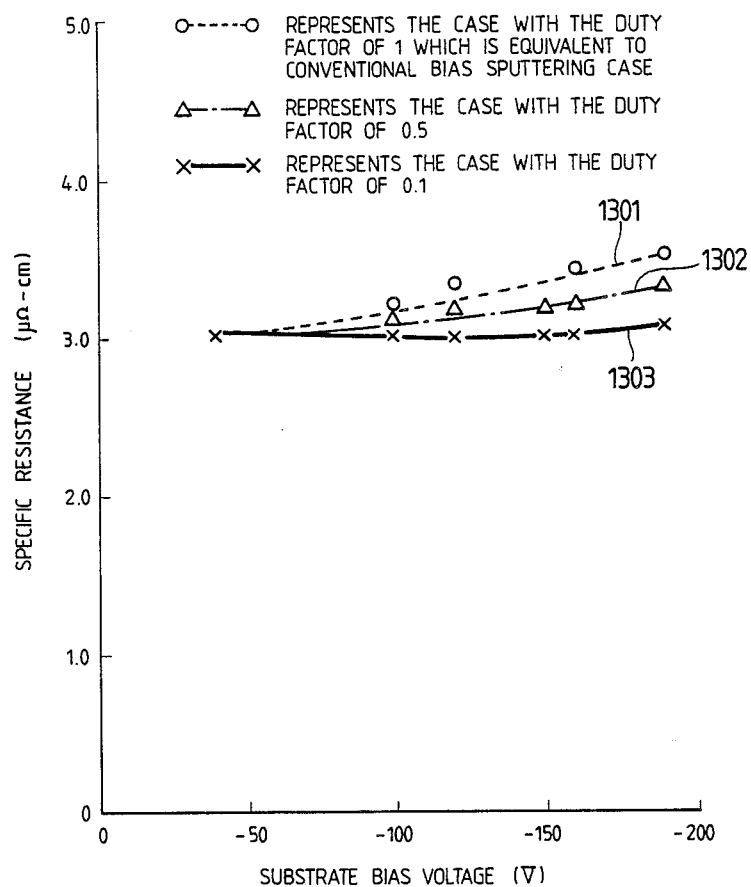
FIG. 15 is a graph showing the relation between the specific resistance of aluminum films formed by a bias sputtering process and substrate bias voltage with duty ratio as a parameter.

Furthermore, as is obvious from FIG. 15, the first embodiment of the present invention is capable of suppressing increase in the specific resistance of the film.

The effect of application of a bias voltage in the initial stage of the film forming operation, which is one of the significant effects of the present invention, will be described hereinafter.

Electromigration life is one of the factors causing failures in films for wiring semiconductor devices. Increase in the degree of integration of semiconductor devices requires reduction in size of semiconductor devices, which in turn requires reduction is the width of wiring films; consequently, current density in the wiring film is increased accordingly and the increased energy of the flow of electrons causes the migration of atoms of the metal forming the wiring film entailing the growth of hillocks, which causes breakage of the wiring film or short circuits between the wiring films. It is known that the electromigration life and the (111) crystallographic orientation are closely related with each other. That is, it is known that a film having a high ratio: I(111)/I(200), where I(111) is the (111) x-ray diffraction intensity of the film, and I(200) is the (200) x-ray diffraction intensity of the film, has a long electromigration life. A film of 1 μm in thickness formed by applying no substrate bias voltage to the substrate until the thickness reached 0.5 μm and applying the first power (150 W, $V_{dc}$ = −100 V) to the substrate under a biasing condition in which the duty factor was 0.2 to form the rest of the film, and another film of 1 μm in thickness formed by applying the first power 150 W, $V_{dc}$ = −100V) to the substrate under a biasing condition in which the duty factor was 0.2 until the thickness reached 0.5 μm and applying no bias voltage to the substrate to form the rest of the film were evaluated in terms of the ratio I(111)/I(200). The ratio I(100)/I(200) of the former film was $2 \times 10^3$, while that of the latter film was $5 \times 10^4$. Thus, a film having a high (111) crystallographic orientation can be formed merely by exposing the surface of a substrate to an appropriate amount of argon ions having an appropriate energy only in the initial stage of the film forming operation in which nuclei are produced and the nuclei grow.

The change of the data file during the film forming process will be described hereinafter.

Figure 13:
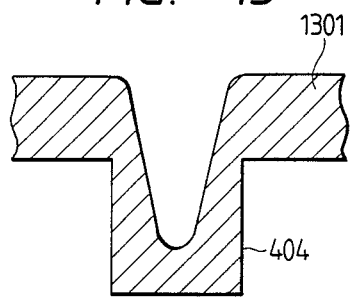
FIG. 13 is an illustration showing a film formed on an irregular surface in a first film forming stage of a sputtering process in which sputtering operation is carried out in two film forming stages.

Suppose that the bias sputtering process uses two data files, namely, a first data file ($V_s$ = −10V, $V_d$32 −150V, duty factor = 0.4, pulse shape = rectangular, period = 100 microsec), and a second data file (($V_s$ = −10V, $V_d$ = −150V, duty factor = 0.1, pulse shape = rectangular, period = 100 microsec), for one cycle of the film forming operation. The second data file has the duty factor smaller than hat of the first data file to apply a low power, which is a third a power applied to the substrate during a period in which the first data file is used, to the substrate. In the initial stage of the film forming operation for forming a film of 1 μm in thickness, the first data file is used until a film of about 0.5 μm in thickness is formed, and then the second data file is used to form the rest of the film. It is obvious from FIG. 13 showing the conformance of the film of 0.5 μm in thickness formed by using the first data file to a through hole of 1 μm in diameter and 1.3 μm in depth, the film conforms well to the configuration of the through hole and provides a very advantageous surface for forming the rest of the film in a satisfactory surface coverage. Reduction of the input power of the substrate in the latter stage of the film forming operation maintains the reflectance of the surface of the film at a high level. For example, the reflectance of a film of 1 μm in thickness formed by using only the first data file is 70%, while that of a film of the same thickness formed by using both the first and second data files is 80%.

In forming a film over a layer of insulating film of a polyimide compound, a very low power is applied to the substrate electrode in the initial stage in which the layer of insulating film is liable to be damaged and a necessary and sufficient power is applied to the substrate electrode in the latter stage to prevent excessive rise in temperature of the layer insulating film so that the evaporation or shrinkage of the polyimide compound forming the layer of insulating film and the removal of atoms of impurity gases are suppressed and a film of high quality having satisfactory surface coverage is formed.

Thus, the energy of the power applied to the substrate in one period can be limited to an appropriate level and excessive impact of argon ions on the substrate can be obviated with the substrate bias voltage at a high level which is effective for the improvement of the conformance of the film to the surface configuration by properly controlling the duty factor. Consequently, this embodiment is able to achieve both the formation of an aluminum film capable of satisfactory surface coverage and the formation of an aluminum film of good quality. Furthermore, this embodiment is capable of adjusting the properties of the film at the beginning of the initial stage of the film forming operation in which a continuous film is not yet formed. The waveform, the deepest voltage, the shallowest voltage, the duty factor and the period of application of the substrate bias voltage applied to the substrate may be varied within the scope of the present invention.

A bias sputtering process in a second embodiment according to the present invention will be described hereinafter with reference to FIGS. 16 and 17.

In the second embodiment, a substrate bias voltage having a rectangular pulse waveform which can be controlled easily is used.

Figure 16:
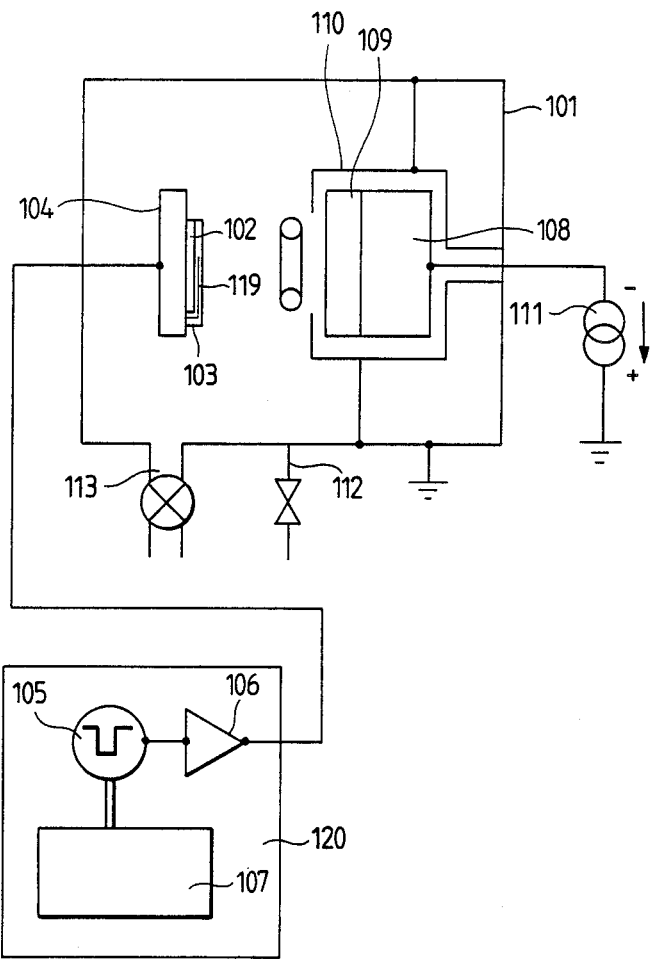
FIG. 16 is a diagrammatic illustration of a sputtering apparatus of a second embodiment according to the present invention, in which bias voltage pulses are applied to the substrate electrode.
Figure 17:
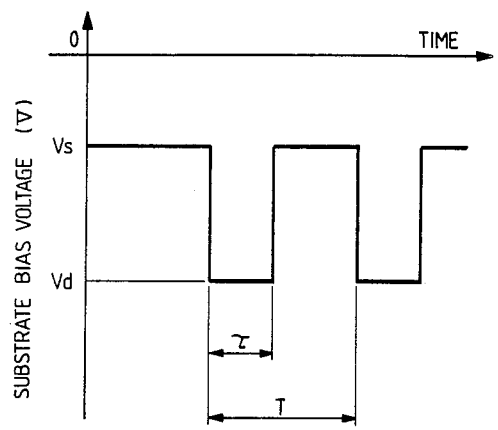
FIG. 17 is a waveform chart showing the waveform of the bias voltage pulses applied to the substrate by the sputtering apparatus of FIG. 16.

Referring to FIG. 16, a bias sputtering apparatus for carrying out the bias sputtering process of the second embodiment is a planar magnetron sputtering apparatus comprising a vacuum vessel 101 having a sputtering gas inlet opening 112 and an evacuating opening 113, a sputtering electrode 108 disposed within the vacuum vessel 101 to support a target 109 thereon, an anode 110 disposed outside the target eroding region so as to surround the sputtering electrode 108 and the target 109 with a gap of about 2 mm therebetween, and a substrate electrode 104 for applying a voltage to a substrate 102 disposed opposite to the sputtering electrode 108. The target 109, for example, is a circular disk of 200 mm in diameter formed of an aluminum alloy (hereinafter referred to simply as "aluminum") of aluminum of a high purity of 99.999% and 1% by weight Si. The substrate 102 on which a film is to be formed is a single crystal silicon wafer of 125 mm in diameter. The sputtering electrode 108 is connected to a dc power supply 111, and the vacuum vessel 101 and the anode 110 are grounded. The substrate electrode 104 is connected to a bias power supply 120 to apply a substrate bias voltage to the substrate 102 in a mode according to the present invention.

The vacuum vessel 101 is evacuated by an evacuator, not shown, connected to the evacuating opening 113 to maintain the partial pressure of gases remaining within the vacuum vessel at a pressure in the range of $10^{-8}$ to $10^{-7}$ torr, and then high-purity argon gas is introduced into the vacuum vessel 101 to maintain the pressure of the argon gas at 3 millitorr. Then, a power of 10 to 20 kW is applied to the sputtering electrode 108 for a film forming operation by sputtering. An aluminum film of about 1 μm in thickness is formed as a wiring film for interconnecting semiconductor devices or for interconnecting the wiring films of adjacent layers.

In a dc bias sputtering process, a very thin film, i.e., a precoating film, must be formed on the substrate 102 before starting a bias sputtering film forming operation to connect electrically the bias power supply 120 and an aluminum film deposited on the substrate 102. An aluminum film 119 of a thickness on the order of 0.1 to 0.2 μm with the substrate 102 in an electrically insulated state (a state in which no bias voltage is applied to the substrate 102), one end of a nail-shaped electrode member 103 having the other end connected to the substrate electrode 104 is brought into contact with the aluminum film 119 to connect the aluminum film 119 to the substrate bias power supply 120, and then aluminum is deposited in a thickness of about 0.8 μm over the aluminum film 119 by a bias sputtering method.

The bias power supply 120 comprises a voltage pulse generator 105, an amplifier 106 for amplifying the voltage pulse signal of a waveform generated by the voltage pulse generator 105, and a computer 107 for storing the shapes of voltage pulse signals in data files and for changing the data file during the film forming operation. FIG. 17 shows, by way of example, the shape of a voltage pulse signal applied to the substrate 102, in which time is measured on the horizontal axis and substrate bias voltage is measured on the vertical axis. The shape of the voltage pulse signal is defined by the deepest substrate bias voltage $V_d$, the shallowest substrate bias voltage $V_s$, time $\tau$ of duration of the deepest substrate bias voltage $V_d$, period T and duty factor $\tau/T$. That is, the deepest substrate bias voltage $V_d$ is applied to the substrate electrode 104 for a time $\tau$ in a time T, and time of duration of the deepest substrate bias voltage $V_d$ increases as the duty factor is increased from 0 to 1. The bias power supply 120 is capable of varying the deepest substrate bias voltage $V_d$ and the shallowest substrate bias voltage $V_s$ within a voltage range of 0 to 300 V, and varying the duty factor within the range of 0.05 to 0.95. In the second embodiment, the shallowest substrate bias voltage $V_s$ is $-50$ V.

The second embodiment is characterized by the movement of argon ions of a plasma according to the waveform of the voltage pulse signal. Generally, when a bias voltage signal of about 5 MHz or above in frequency is applied to the substrate electrode, argon ions are unable to move according to the waveform of the bias voltage signal because argon ions have a large mass, whereas electrons move according to the waveform of the bias voltage signal, and hence discharge occurs at the substrate electrode 104. Therefore, in accordance with the present invention, the frequency of the bias voltage signal is 1 MHz or below, namely, the period of the bias voltage signal is 1 microsec or above, to enable the argon ions to move according to the waveform of the bias voltage signal. In the second embodiment, the period T of the waveform of the bias voltage signal is 1 millisec.

FIG. 11 shows forms of films formed by the bias sputtering process in the second embodiment by using only one data file over the surface of through holes for the duty factor as parameter.

When the duty factor is in the range of 0 to 0.1, no void is formed in the through hole. The film conforms satisfactorily to the surface of the through hole in good through hole coverage when the duty factor is in the range of 0.2 to 0.4. Overhangs 31 of the aluminum film are formed around the through hole to obstruct the formation of the aluminum film over the surface of the through hole due to excessive rise in temperature of the aluminum film when the duty factor is in the range of 0.5 to 0.7. When the duty factor is 0.8 or above, a void is formed in the through hole due to the impact of excessive argon ions on the surface of the aluminum film.

The effect of the present invention on the improvement of the quality of aluminum films will be described hereinafter in terms of reflectance as an index of surface roughness of the film, and specific resistance representing faults remaining within the minute structure of the film.

FIG. 12 shows the reflectances of the surfaces of aluminum films formed by the bias sputtering process in the second embodiment as measured by using light of 405 nm in wavelength., in which the deepest substrate bias voltage $V_d$ is measured on the horizontal axis. In FIG. 12, curves 1201, 1202 and 1203 indicate the variation of reflectance with substrate bias voltage respectively for duty factors of 0.2, 0.5 and 1 (equivalent to the condition of substrate bias voltage application in the conventional process). In either case, the reflectance decreases with the increase of substrate bias voltage; however, the reduction of reflectance is smaller when the duty factor is smaller.

The variation of the specific resistance of aluminum films formed by the bias sputtering process in the second embodiment with the deepest substrate bias voltage $V_d$ is shown in FIG. 15, in which curves 1301, 1302 and 1303 indicate the variation of specific resistance with the substrate bias voltage respectively for duty factors of 1 (equivalent to the condition of substrate bias voltage application in the conventional process), 0.5 and 0.1. When the duty factor is 1, the greater the substrate bias voltage the higher the specific resistance becomes thereby deteriorating the properties of the aluminum film. When the duty factor is 0.1, the specific resistance remains stable and substantially constant at 3.0 $\mu\Omega$—cm close to the bulk value of 2.7 $\mu\Omega$—cm regardless of the variation of the substrate bias voltage. Thus, the second embodiment reduces the possibility of formation of faults in the minute structure of the film. That is, the energy of power applied to the substrate in one period can be limited to an appropriate level maintaining the deepest substrate bias voltage at a level effective on the improvement of the surface coverage of the film by properly controlling the duty factor. Consequently the second embodiment is able to achieve both the formation of an aluminum film capable of satisfactory surface coverage and the formation of an aluminum film of good quality.

The effect of changing the data file during the film forming operation will be described hereinafter.

Figure 18:
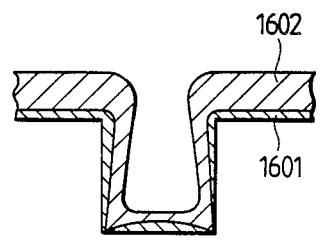
FIG. 18 is an illustration showing a film formed on an irregular surface by a sputtering process in which the waveform of the bias voltage is varied in two stages.

The bias sputtering process uses two data files, which are the same in the peak voltage and different from each other in the energy of power applied to the substrate electrode in the same period, for example, a first data file defining a voltage pulse signal of $V_s32$ —50$V$, $V_d$=—200$v$ and a duty factor =0.4, and a second data file defining a voltage pulse signal of $V_s32$ —50$V$, $V_d32$ —200$V$ and a duty factor =0.1. Since the duty factor of the second data file is smaller than that of the first data file, the energy of power applied to the substrate in one period is smaller than that applied to the substrate in the same period. In the initial stage of the film forming operation for forming a film of 1 $\mu$m in thickness, a film of about 0.4 $\mu$m in thickness is formed by bias sputtering using the first data file after forming a precoating film of 0.2 $\mu$m, and then a film of 0.4 $\mu$m in thickness is formed by bias sputtering using the second data file, in which the energy of power applied to the substrate in one period is reduced. The conformance of the aluminum film of 0.6 $\mu$m thus formed under the power supply condition defined by the first data file to the surface configuration of the substrate is shown in FIG. 18. As is obvious from FIG. 18, the aluminum film of 0.6 $\mu$m in thickness conforms well to the surface of the through hole forming an advantageous underlying surface for the latter aluminum film of 0.4 $\mu$m in thickness.

The reduction of energy of the power applied to the substrate in each period in the latter stage of the film forming operation maintains the reflectance of the surface of the aluminum film at a high level. For example, whereas the reflectance of an aluminum film of 1 $\mu$m in thickness including a precoating film, formed by a bias sputtering process using only the first data file is as low as 60%, the reflectance of the surface of the aluminum film of 1 $\mu$m in thickness formed by the film forming operation using the first and second data files respectively in the initial and latter stages is as high as 70%.

When a layer of insulating film formed of a polyimide compound is used, an aluminum film of a satisfactory quality can be formed over the layer of insulating film in satisfactory surface coverage, for example, by applying a low power to the substrate in the initial stage of the film forming operation in which the layer of insulating film is liable to be damaged and applying a necessary and sufficient power to the substrate in the latter stage of the film forming operation to prevent excessive rise in temperature of the aluminum film, the evaporation and shrinkage of the polyimide compound and the removal of impurity gases from the polyimide compound.

In accordance with the present invention, any number of different data files may be used in one cycle of the film forming operation taking into consideration the dimensions of through holes and the properties of the underlying layer. The present invention is not limited in its practical application to the foregoing embodiments, but may be practiced in various embodiments within the scope of the present invention. For example, the waveform of the substrate bias voltage need not be limited to a rectangular waveform, but may be a composite waveform consisting of two or more rectangular waveforms, a sinusoidal waveform, a composite waveform consisting of a plurality of sinusoidal waveforms or any one of those waveforms shifted by a fixed voltage.

The precoating film need not be limited to an aluminum film, but may be a film of Ti, Mo, Ta, W, a silicide of any one of those metals or a nitride of any one of those metals.

The wiring film is not limited to an aluminum or an aluminum alloy film, but may be a film of any one of metals including Ti, Mo and W, or any one of alloys of those metals.

A bias sputtering process in a third embodiment according to the present invention will be described hereinafter. The third embodiment uses, in combination, means for moving a plasma ring and the foregoing substrate bias voltage control mode.

Figure 19:
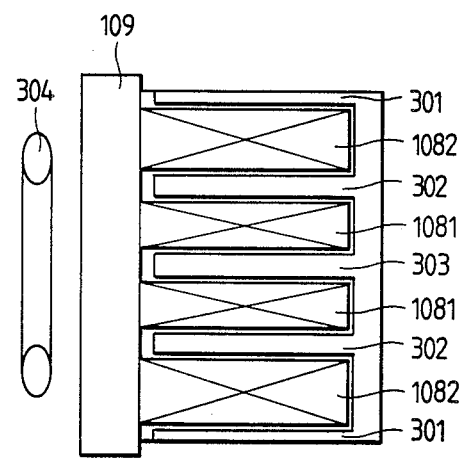
FIG. 19 is a conceptual view of a double electromagnet sputtering cathode employed in the sputtering apparatus of a third embodiment according to the present invention.

First, a double electromagnet sputtering cathode employed in the third embodiment will be described with reference to FIG. 19. As shown in FIG. 19, the double electromagnet sputtering cathode comprises an inner coil 1081, an outer coil 1082, a sputtering target 109 attached to the front surfaces of the coils 1081 and 1082, an outer yoke 301, an intermediate yoke 302 and a central yoke 303. The position of a plasma 304 produced in front of the sputtering target 109 is dependent on the ratio between a current $I_{in}$ supplied to the inner coil 1081 and a current $I_{out}$ supplied to the outer coil 1082. Shifting the position of the plasma 304 provides the following advantages.

1. Improvement in the distribution of a film within a substrate

2. Extension of the life of the sputtering target

A double electromagnet sputtering process is disclosed in U.S. Pat. No. 4,401,539.

The use of the double electromagnet sputtering cathode in combination with the apparatus shown in FIG. 1 or the apparatus shown in FIG. 16 provides both the aforesaid advantages of the double electromagnet sputtering process and those of the first or second embodiment.

Figure 20:
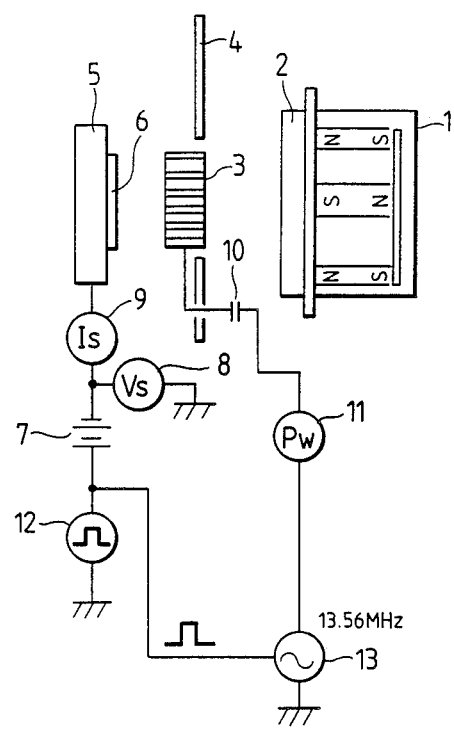
FIG. 20 is a diagrammatic illustration of a sputtering apparatus of a fourth embodiment according to the present invention, in which bias voltage pulses are applied to a substrate, and a filter is provided to control the directivity of particles sputtering from a target.

Referring to FIG. 20, there is shown a known planar magnetron sputtering electrode 1, a target 2, a filter 3, an antideposition shielding plate 4, a substrate electrode 5, a substrate (wafer) 6, a dc power supply 7 for applying a bias voltage to the substrate electrode 5, a voltmeter 8, an ammeter 9 for measuring a substrate current, a blocking capacitor 10, a through-line wattmeter 11, a pulse power supply 12, and a radio frequency power supply 13, for example, for supplying an alternating power of 13.56 MHz in frequency.

Such a disposition of the filter 3 between the target 2 and the substrate 6 is disclosed in U.S. Pat. No. 4,724,060.

Figure 21:
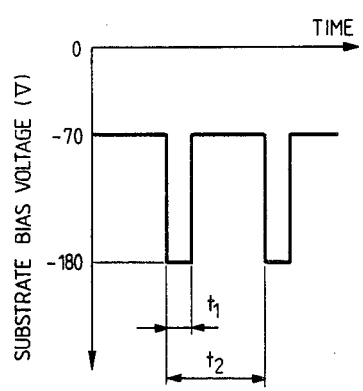
FIG. 21 is a waveform chart of bias voltage pulses applied to the substrate electrode of FIG. 20.

The output signal of the pulse power supply 12 may be used as a modulating signal for the radio frequency power supply 13. The substrate biasing dc power supply 7 applies a negative voltage to the substrate electrode 5. The output voltage and output current of the substrate biasing dc power supply 7 are monitored continuously by the voltmeter 8 and the ammeter 9, respectively. The pulse power supply 12 is connected to the substrate biasing dc power supply 7 to apply a superposed voltage of the respective output voltages of the substrate biasing dc power supply 7 and the pulse power supply 12 to the substrate electrode 5. In the following experimental film forming operation, the output voltage of the substrate biasing dc power supply 7 is fixed at −70 V, the peak output voltage of the pulse power supply 12 is −110 V, and the composite output voltage of the dc power supply 7 and the pulse power supply 12 has a waveform as shown in FIG. 21 having a frequency of 50 kHz and a duty factor ($t_1/t_2$ in FIG. 21) on the order of 0.5%.

The substrate 6 is mounted fixedly on the substrate electrode 5. The substrate 6 is a silicon wafer of 100 mm in diameter. During the film forming operation, the substrate 6 is held firmly in electrical contact with the substrate electrode 5 with a finger-shaped fastening means.

The frequency of the output of the radio frequency power supply 13 is 13.56 MHz. The output of the radio frequency power supply 13 is applied through a matching box, not shown, to the filter 3. The through-line wattmeter 11 monitors the power applied to the filter 3.

Figure 22:
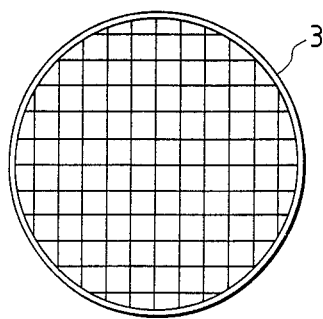
FIG. 22 is a schematic plan view of a filter.

As shown FIG. 22, the filter 3 is a grid consisting of thin plates of 1 mm in thickness forming square apertures of about 9 mm × about 9 mm, and having a diameter of 160 mm and a thickness, i.e., a dimension along the direction of movement of sputtered particles, of about 10 mm.

The substrate 6 was a sample silicon wafer of 100 mm in diameter, having a test configuration simulating the configuration of a wafer having through holes for interconnecting the wiring layers of a multilayer wiring structure to evaluate the surface coverage of films formed by the bias sputtering process in the fourth embodiment according to the present invention.

The distances between the opposite surfaces of the substrate 6 and the filter 3 and between the opposite surfaces of the target 2 and the filter 3 were about 30 mm. The target 2 was an 8 in. aluminum plate (approximately 200 mm in diameter) containing 1.5% by weight silicon.

The vacuum vessel of the bias sputtering apparatus was evacuated by a suitable vacuum pump, not shown, to a high vacuum in the range of $10^{-8}$ to $10^{-7}$ torr, and then argon gas was introduced into the vacuum vessel so as to maintain argon gas pressure at about 3.5 millitorr.

The radio frequency power supply 13 is connected through a matching circuit, not shown, and the blocking capacitor 10 to the filter 3.

A sputtering voltage of about 500 V and a sputtering current of 10 A were applied to the sputtering electrode 1 to cause the sputtering electrode 1 to discharge.

Voltage pulses were applied to the substrate electrode 5. The output of the radio frequency power supply 13 for the filter 3 was fixed at 50 W.

FIG. 21 shows the waveform of a voltage signal applied to the substrate electrode 5. The output voltage of the dc power supply 7 for biasing the substrate 5 was fixed at −70 V, the peak voltage of the pulse power supply 12 was −110 V, and hence the peak voltage of the voltage pulse signal was −180 V as shown in FIG. 21. As shown in FIG. 21, the period of the voltage pulse signal was $t_2$ sec and the duration of the peak voltage of −180 V was $t_1$. The ratio $t_1 t_2$ is designated as duty factor. The duration of the peak value of the substrate bias voltage increases with the increase of duty factor.

The through hole coverage of aluminum films formed respectively at different duty factors was evaluated. When a fixed substrate bias voltage of −180 V was applied continuously to the substrate electrode 5, a permanent void was formed in the through hole. When the substrate bias voltage of −180 V was applied intermittently to the substrate electrode 5, no void was formed when the duty factor was in the range of 0 to 0.2%, and the surface of the through hole was coated satisfactorily with the aluminum film when the duty factor was in the range of 0.3 to 0.6%. However, a void was formed in the through hole even when the substrate bias voltage of −180 V was applied intermittently to the substrate electrode 5 when the duty factor was 0.7% or above, which was the same as a result of continuous application of the substrate bias voltage of −180 V to the substrate electrode 5. Thus, the surface of the through hole can be coated satisfactorily with an aluminum film without forming any void therein by intermittently applying a comparatively high substrate bias voltage to the substrate electrode 5 at an appropriate duty factor. Since the output of the pulse power supply 12 is applied to the radio frequency power supply 13, increase in the negative output of the pulse power supply 12 increases the output of the radio frequency power supply 13.

The results of experiments under conditions, where the period of output waveform of the pulse power supply 12 was 50 kHz and the duty factor was 0.5%, and the sputtering power was 10 A × 500 V, showed that the filter 3 was deformed when the output of the radio frequency power supply 13 was 100 W, while the filter 3 was not deformed under the foregoing conditions.

Figure 23:
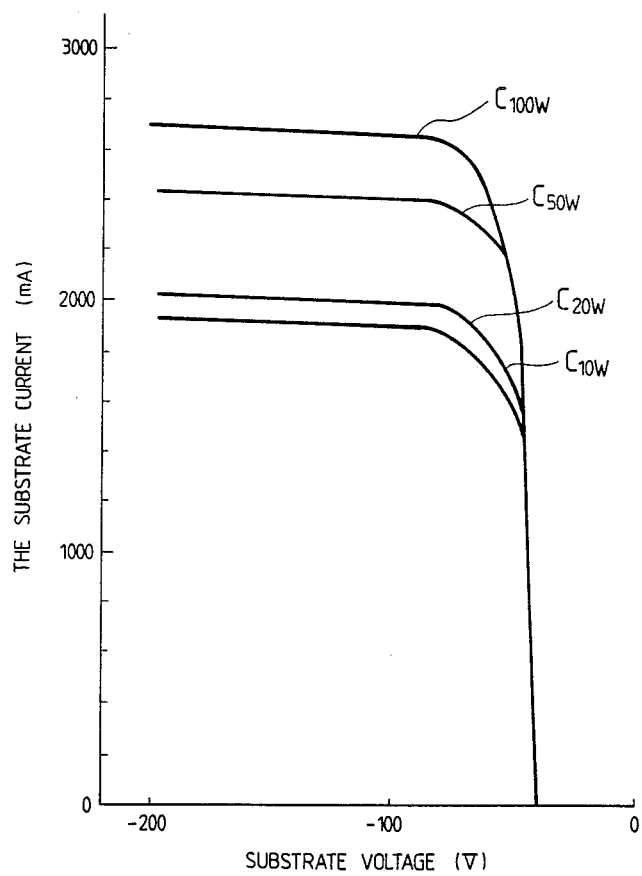
FIG. 23 is a graph showing the relation between substrate current and substrate voltage for filter excitation radio frequency power as parameter.

FIG. 23 shows the variation of the substrate current with the substrate voltage for the output power of 13.56 MHz of the radio frequency power supply 13, in which curves C10W, C20W, C50W and C100W are for 10 W, 20 W, 50 W and 100 W, respectively. The filter 3 was not deformed even when a large current (for example, a current corresponding to 100 W) sufficient to coat the surface of the through hole satisfactorily with an aluminum film was supplied to the substrate.

Thus, the third embodiment controls the direction of travel of the sputtered particles by the filter 3 having a cylindrical shape and formed of the thin plates so that the reduction in the aluminum particle transmittivity is limited to the least extent and causes hollow cathode discharge within the filter 3 to supply a large substrate current when a negative voltage is applied to the substrate electrode 5 so that an aluminum film will be formed in satisfactory surface coverage. Overheating of the substrate 6 is prevented by applying the substrate bias voltage intermittently in voltage pulses. The target 2 is formed of a metallic material having a comparatively low melting point, such as aluminum or an aluminum alloy.

As is obvious from FIG. 23, to increase the substrate current, power applied to the filter 3 must be increased accordingly. Ordinarily, power applied to the filter 3 is in the range of 10 to 200 W. Since the negative voltage applied to the filter 3 is varied in synchronism with the variation of the substrate bias dc voltage, the filter will not be deformed even if the substrate current is increased, and hence a film can be stably formed in satisfactory through hole coverage.

In the planar magnetron bias sputtering process, the electrically excited filter 3 serves as a third electrode and second discharge occurs at the filter 3. To suppress the sputtering of the material forming the filter 3, the filter 3 is formed in a cylindrical shape so that the discharge occurs at the lowest necessary voltage, and hollow cathode discharge that occurs within the filter 3 is used.

In effectively applying impact on an aluminum film by argon ions during the film forming operation in order to activate the migration of aluminum atoms within the aluminum film by the increased substrate current, i.e., an increased argon ion current, the sputtering apparatus for executing the planar magnetron bias sputtering process of the present invention does not require continuous application of a substrate bias voltage to obtain a sufficiently high current density, but requires intermittent application of a substrate bias voltage. Concretely, a voltage may be applied to the substrate electrode so that the substrate electrode is charged intermittently at a high negative potential. If the temperature of the substrate is excessively high, aluminum particles do not flow effectively into the through hole. It is essential to the improvement of the through hole coverage of the film to prevent the growth of overhangs, which close the through hole, around the edge of the through hole. In the third embodiment, upon the growth of a small overhang, a substrate bias voltage is applied to the substrate electrode to cause the aluminum particles forming the overhang to flow. In the third embodiment, the effect of intermittent application of the substrate bias voltage on the improvement of the surface coverage of the film can be enhanced by the effect of giving directivity to sputtered particles of the filter on the retardation of the growth of overhangs. Thus, the substrate is not exposed to an excessive impact of argon ions, and hence the temperature of the substrate does not rise excessively.

Uniform distribution of argon ion current density over the surface of the substrate can be maintained by shifting the position of the plasma relative to the substrate to average the respective time periods of exposure of individual portions of the surface of the substrate to argon ions. When an electromagnetic magnetron sputtering electrode capable of varying the diameter of a plasma ring is disposed coaxially with the substrate, the ion current density in the central portion of the substrate can be increased by reducing the diameter of the plasma ring, and the ion current density in the peripheral portion of the substrate can be increased by increasing the diameter of the plasma ring. The film forming rate is not necessarily proportional to the ion current density. A flat distribution of film forming rate over the surface of the substrate is obtained by varying the sputtering power with the shift of the plasma ring so that the distribution of the ion current density over the surface of the substrate is uniform. In such a case, the third embodiment is able to regulate properly the distribution of film forming rate and that of ion current density by controlling the potential of the filter simultaneously with the variation of the sputtering power.

Thus, the third embodiment reduces power loss at the filter, the filter need not be water-cooled, and stably forms a film with satisfactory through hole coverage.

As is apparent from the foregoing description, the present invention is capable of solving the problems in the conventional bias sputtering processes and forming a film of improved quality in satisfactory conformance to the configuration of the underlying layer.

What is claimed is:

1. A sputtering process comprising continuously applying a bias voltage having a single polarity to a substrate electrode in a vacuum atmosphere during forming of a film over the surface of a substrate, varying the applied bias voltage and controlling a duty factor of the applied bias voltage so that the magnitude of the kinetic energy of ions of a sputtering gas impacting the substrate is varied periodically.

2. A sputtering process according to claim 1, wherein the waveform of said bias voltage is a voltage pulse stream.

3. A sputtering process according to claim 2, wherein the step of said voltage pulse is always on the negative side of the floating voltage of the substrate.

4. A sputtering process according to claim 2, wherein the form of the voltage pulse stream of said bias voltage is varied during one portion of a film forming operation.

5. A sputtering process according to claim 1, wherein the said bias voltage is a radio frequency bias voltage.

6. A sputtering process according to claim 5, wherein the average voltage waveform with respect to time of said bias voltage is a waveform of a frequency not higher than 1 MHz.

7. A sputtering process according to claim 5, wherein a waveform of an average voltage determined from a first envelope passing through a plurality of upper peak points of a voltage waveform of said bias voltage, and a second envelope passing through a plurality of lower peak points of the voltage waveform of said bias voltage is controlled such that the average voltage is of a negative polarity in a period where the amplitude of said radio frequency bias voltage is at a maximum and in a period where the amplitude of said radio frequency bias voltage is at a minimum.

8. A sputtering process according to claim 7, wherein the carrier of the voltage waveform of said bias voltage is a radio frequency wave of 5 MHz or higher, and the repetition frequency of first and second envelopes passing through the peak points of the voltage waveform of the carrier is 1 MHz or lower.

9. A sputtering process according to claim 5, wherein the voltage waveform of said bias voltage is varied during one portion of a film forming operation.

10. A sputtering process according to claim 1, further comprising optionally changing the position of a plasma by varying the ratio between currents supplied respectively to a plurality of annular exciting coils disposed coaxially with a target used to produce sputtered particles.

11. A sputtering process according to claim 1, further comprising utilizing a filter for giving directivity to particles sputtered from a target.

12. A sputtering process according to claim 11, wherein the variation of voltage applied to said filter is synchronous with that of said bias voltage.

13. A sputtering apparatus comprising: a vacuum vessel; a sputtering electrode disposed within the vacuum vessel; a sputtering power supply connected to the sputtering electrode; evacuating means for evacuating the vacuum vessel; sputtering gas supply means; a substrate bias electrode for holding a substrate on which a film is to be formed and for continuously applying a bias voltage having a single polarity to the substrate; a bias voltage power supply means for continuously applying the bias voltage of a single polarity to the substrate bias electrode for application to the substrate and for controlling the intensity of ions of a sputtering gas on the substrate; and means for varying the applied bias voltage and for controlling the duty factor of the applied bias voltage so that the kinetic energy of the ions of the sputtering gas impacting the substrate is varied periodically.

14. A sputtering apparatus according to claim 13, wherein the voltage waveform of said bias voltage is a voltage pulse stream.

15. A sputtering apparatus according to claim 13, wherein the voltage waveform of said bias voltage is a radio frequency voltage waveform.

16. A sputtering apparatus according to claim 15, wherein the tim-average voltage waveform of said bias voltage is a waveform of a frequency of 1 MHz or below.

17. A sputtering apparatus according to claim 15, wherein a waveform of an average voltage determined from a first envelope passing through a plurality of upper peak points of a voltage waveform of said bias voltage, and a second envelope passing through a plurality of lower peak points of the voltage waveform of said bias voltage is controlled such that the average voltage is of a negative polarity during a period where the amplitude of the waveform of said radio frequency bias voltage is a maximum and during a period where the amplitude of the waveform of said radio frequency bias voltage is a minimum.

18. A sputtering apparatus according to claim 17, wherein the carrier wave of the voltage waveform of said bias voltage is a radio frequency wave of 5 MHz or higher, and the repetition frequency of the voltage waveforms of first and second envelopes passing respectively through peak points of the carrier wave is 1 MHz or below.

19. A sputtering apparatus according to claim 13, wherein said bias voltage includes a plurality of voltage pulses having a step which is always on the negative side of the floating voltage of the substrate.

20. A sputtering apparatus according to claim 13, further comprising a sputtering mechanism including a plurality of annular exciting coils disposed coaxially with the sputtering electrode and capable of optionally changing the position of a plasma by varying the ratios between currents supplied respectively to the plurality of annular exciting coils.

21. A sputtering apparatus according to claim 13, further comprising utilizing a filter for giving, directivity to particles sputtered from a target.

22. A sputtering apparatus according to claim 21, wherein the variation of the voltage applied to said filter is synchronous with that of the bias voltage.

* * * * *